(12) United States Patent
Nakagawa et al.

(10) Patent No.: US 9,035,295 B2
(45) Date of Patent: May 19, 2015

(54) THIN FILM TRANSISTOR HAVING AN OXIDE SEMICONDUCTOR THIN FILM FORMED ON A MULTI-SOURCE DRAIN ELECTRODE

(75) Inventors: Okifumi Nakagawa, Osaka (JP); Yoshifumi Ohta, Osaka (JP); Yuuji Mizuno, Osaka (JP); Yoshimasa Chikama, Osaka (JP); Tsuyoshi Inoue, Osaka (JP); Masahiko Suzuki, Osaka (JP); Michiko Takei, Osaka (JP); Yoshiyuki Harumoto, Osaka (JP); Yoshinobu Miyamoto, Osaka (JP); Hinae Mizuno, legal representative, Yamato (JP)

(73) Assignee: Sharp Kabushiki Kaisha, Osaka (JP)

( * ) Notice: Subject to any disclaimer, the term of this patent is extended or adjusted under 35 U.S.C. 154(b) by 150 days.

(21) Appl. No.: 13/640,868

(22) PCT Filed: Apr. 5, 2011

(86) PCT No.: PCT/JP2011/058589
§ 371 (c)(1),
(2), (4) Date: Nov. 28, 2012

(87) PCT Pub. No.: WO2011/129227
PCT Pub. Date: Oct. 20, 2011

(65) Prior Publication Data
US 2013/0134411 A1 May 30, 2013

(30) Foreign Application Priority Data
Apr. 14, 2010 (JP) .................................. 2010-093436

(51) Int. Cl.
*H01L 29/12* (2006.01)
*H01L 29/10* (2006.01)
(Continued)

(52) U.S. Cl.
CPC ........ *H01L 29/7869* (2013.01); *H01L 27/1225* (2013.01); *H01L 29/66742* (2013.01)

(58) Field of Classification Search
CPC ............ H01L 27/1225; H01L 29/7869; H01L 29/66742; H01L 29/786; H01L 29/66
USPC .................. 257/43, 57, 66, E27.06, E29.242, 257/E29.466, E21.135, 347; 438/104, 158, 438/29
See application file for complete search history.

(56) References Cited

U.S. PATENT DOCUMENTS 4,700,458 A 10/1987 Suzuki et al.
5,898,187 A * 4/1999 Kim .............................. 257/57
(Continued)

FOREIGN PATENT DOCUMENTS

JP  58-170065 A  10/1983
JP  2003-298062 A  10/2003
(Continued)

OTHER PUBLICATIONS
Official Communication issued in International Patent Application No. PCT/JP2011/058589, mailed on Jun. 28, 2011.
(Continued)

*Primary Examiner* — Long K Tran
*Assistant Examiner* — Dzung Tran
(74) *Attorney, Agent, or Firm* — Keating & Bennett, LLP

(57) ABSTRACT

A semiconductor device (100A) according to the present invention includes an oxide semiconductor layer (31a), first and second source electrodes (52a1 and 52a2), and first and second drain electrodes (53a1 and 53a2). The second source electrode (52a2) is formed to be in contact with a top surface of the first source electrode and inner to the first source electrode (52a1). The second drain electrode (53a2) is formed to be in contact with a top surface of the first drain electrode (53a1) and inner to the first drain electrode (53a1). The oxide semiconductor layer (31a) is formed to be in contact with the top surface of the first source electrode (52a1) and the top surface of the first drain electrode (53a1).

8 Claims, 4 Drawing Sheets

(51) Int. Cl.
　　*H01L 29/76* (2006.01)
　　*H01L 21/00* (2006.01)
　　*H01L 29/786* (2006.01)
　　*H01L 27/12* (2006.01)
　　*H01L 29/66* (2006.01)

(56) References Cited

U.S. PATENT DOCUMENTS

| | | | |
|---|---|---|---|
| 2007/0187760 A1* | 8/2007 | Furuta et al. | 257/347 |
| 2010/0032667 A1 | 2/2010 | Yamazaki et al. | |
| 2010/0032668 A1 | 2/2010 | Yamazaki et al. | |
| 2010/0051936 A1 | 3/2010 | Hayashi et al. | |
| 2010/0055832 A1 | 3/2010 | Akimoto et al. | |
| 2010/0065839 A1* | 3/2010 | Yamazaki et al. | 257/43 |
| 2010/0117072 A1 | 5/2010 | Ofuji et al. | |
| 2010/0117073 A1* | 5/2010 | Yamazaki et al. | 257/43 |
| 2010/0133530 A1* | 6/2010 | Akimoto et al. | 257/43 |
| 2010/0193782 A1 | 8/2010 | Sakata | |
| 2010/0213461 A1 | 8/2010 | Akimoto et al. | |
| 2011/0115763 A1* | 5/2011 | Yamazaki et al. | 345/204 |
| 2012/0228615 A1* | 9/2012 | Uochi | 257/57 |

FOREIGN PATENT DOCUMENTS

| | | |
|---|---|---|
| JP | 2008-166716 A | 7/2008 |
| JP | 2008-277101 A | 11/2008 |
| JP | 2009-253204 A | 10/2009 |
| JP | 2010-062546 A | 3/2010 |
| JP | 2010-062547 A | 3/2010 |
| JP | 2010-080954 A | 4/2010 |
| JP | 2010-206190 A | 9/2010 |
| JP | 2010-226097 A | 10/2010 |

OTHER PUBLICATIONS

English translation of Official Communication issued in corresponding International Application PCT/JP2011/058589, mailed on Nov. 15, 2012.

* cited by examiner

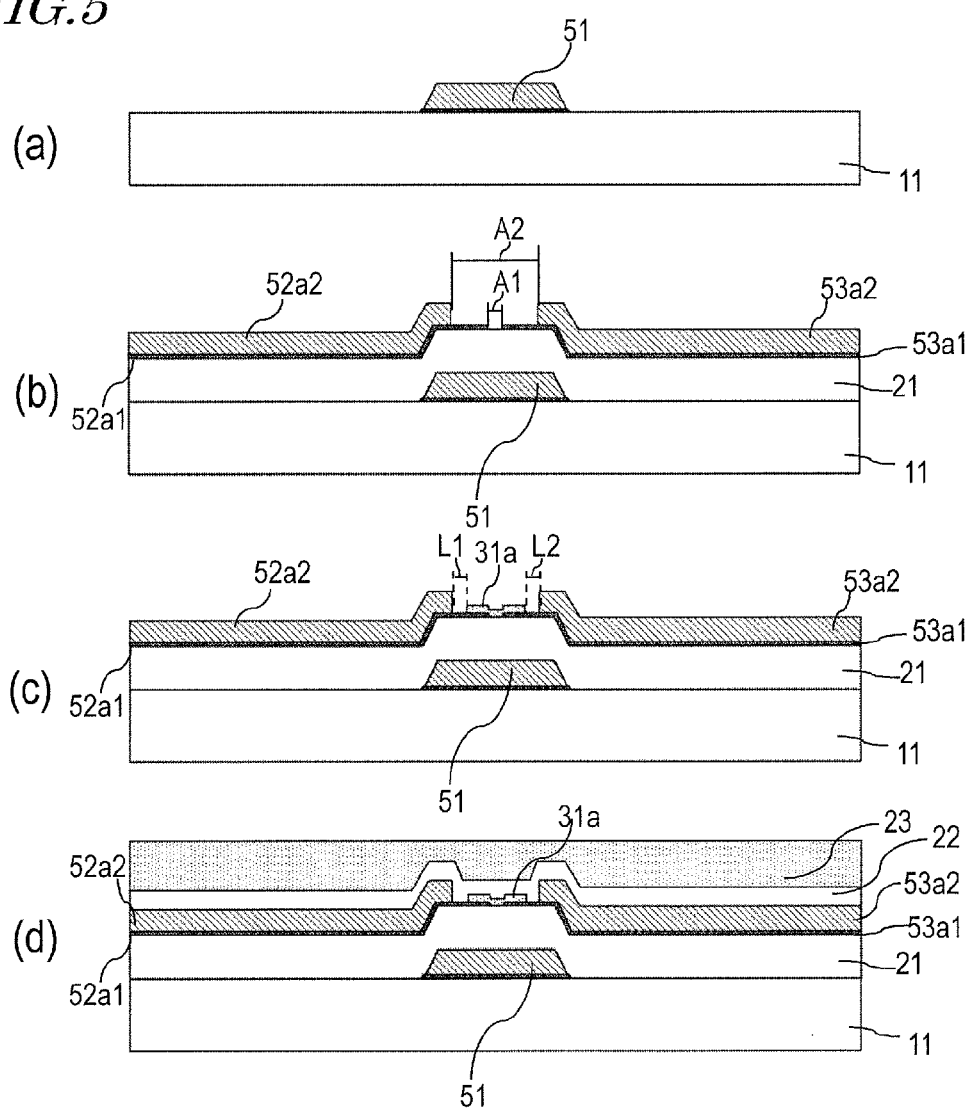

THIN FILM TRANSISTOR HAVING AN OXIDE SEMICONDUCTOR THIN FILM FORMED ON A MULTI-SOURCE DRAIN ELECTRODE

TECHNICAL FIELD

The present invention relates to a semiconductor device including a thin film transistor (TFT) using an oxide semiconductor, a method for producing such a semiconductor device, and a display device.

BACKGROUND ART

Recently, TFTs using an oxide semiconductor layer containing indium (In), zinc (Zn), gallium (Ga) or the like have been actively developed (e.g., Patent Documents 1 through 4). A TFT using an oxide semiconductor has a feature of having a high mobility.

However, in the case of the TFT having an oxide semiconductor layer, in the step of etching for forming source and drain electrodes, the oxide semiconductor layer below the layer to be etched is likely to be damaged. Therefore, there is a problem that in the case where an oxide semiconductor layer is used as a channel region of the TFT, it is difficult to obtain stable TFT characteristics.

As a measure against this, Patent Document 3, for example, proposes forming an insulating layer for protecting a channel region (hereinafter, this insulating layer will be referred to as a "protective layer") on the oxide semiconductor layer. Such a structure, for example, prevents the resistance of the channel region of the oxide semiconductor layer from being reduced due to oxygen deficiency, which is caused in the step of etching for forming the source and drain electrodes. As a result, TFT characteristics with a small OFF currency can be realized.

CITATION LIST

Patent Literature

Patent Document 1: Japanese Laid-Open Patent Publication No. 2003-298062
Patent Document 2: Japanese Laid-Open Patent Publication No. 2009-253204
Patent Document 3: Japanese Laid-Open Patent Publication No. 2008-166716
Patent Document 4: Japanese Laid-Open Patent Publication No. 2008-277101

SUMMARY OF INVENTION

Technical Problem

However, according to the method for producing a TFT described in Patent Document 3, the protective layer is formed of silicon dioxide ($SiO_2$) or silicon nitride ($SiN_x$). This involves a problem that the number of production steps is increased and thus the production cost is raised.

The present invention made in light of the above-described problems has an object of providing a semiconductor device having superb characteristics and a method for producing a TFT with which increase of the production cost is suppressed.

Solution to Problem

A semiconductor device according to the present invention includes an insulating substrate; a gate electrode formed on the insulating substrate; an insulating layer formed on the gate electrode; an oxide semiconductor layer formed on the insulating layer and containing at least one element selected from the group consisting of In, Zn and Ga; first and second source electrodes formed on the insulating layer; and first and second drain electrodes formed on the insulating layer. The second source electrode is formed to be in contact with a top surface of the first source electrode and inner to the first source electrode; the second drain electrode is formed to be in contact with a top surface of the first drain electrode and inner to the first drain electrode; and the oxide semiconductor layer is formed to be in contact with the top surface of the first source electrode and the top surface of the first drain electrode.

In an embodiment, the oxide semiconductor layer is not in contact with either the second source electrode or the second drain electrode.

A semiconductor device in another embodiment according to the present invention includes an insulating substrate; a gate electrode formed on the insulating substrate; an insulating layer formed on the gate electrode; an oxide semiconductor layer formed on the insulating layer and containing at least one element selected from the group consisting of In, Zn and Ga; first and second source electrodes formed on the insulating layer; and first and second drain electrodes formed on the insulating layer. The second source electrode is formed to be in contact with a bottom surface of the first source electrode; the second drain electrode is formed to be in contact with a bottom surface of the first drain electrode; and the oxide semiconductor layer is formed to be in contact with a top surface of the first source electrode and a top surface of the first drain electrode.

In an embodiment, the oxide semiconductor layer is in contact with a side surface of the second source electrode and a side surface of the second drain electrode.

In an embodiment, the second source electrode is formed inner to the first source electrode; the second drain electrode is formed inner to the first drain electrode; and the oxide semiconductor layer is not in contact with either the second source electrode or the second drain electrode.

In an embodiment, the semiconductor device further includes a third source electrode formed, between the insulating layer and the second source electrode, to be in contact with the second source electrode; and a third drain electrode formed, between the insulating layer and the second drain electrode, to be in contact with the second drain electrode.

In an embodiment, the semiconductor device further includes a third source electrode formed to be in contact with a side surface of the second source electrode, and a third drain electrode formed to be in contact with a side surface of the second drain electrode. The oxide semiconductor layer is in contact with the third source electrode and the third drain electrode.

In an embodiment, the semiconductor device further includes a fourth source electrode formed, between the insulating layer and the second source electrode, to be in contact with the second source electrode; and a fourth drain electrode formed, between the insulating layer and the second drain electrode, to be in contact with the second drain electrode.

In an embodiment, the fourth source electrode and the fourth drain electrode contain titanium oxide.

In an embodiment, the fourth source electrode and the fourth drain electrode contain at least one element selected from the group consisting of Ti, W, Nb, V, Zr, Ni Pt, Pd, Rh, Ir, Mo, Cr and Ta.

In an embodiment, the fourth source electrode and the fourth drain electrode are formed of a nitride material or a silicide material containing at least one element selected from the group consisting of Ti, W, Nb, V, Zr, Ni Pt, Pd, Rh, Ir, Mo, Cr and Ta.

In an embodiment, the third source electrode and the third drain electrode contain titanium oxide.

In an embodiment, the third source electrode and the third drain electrode contain at least one element selected from the group consisting of Ti, W, Nb, V, Zr, Ni, Pt, Pd, Rh, Ir, Mo, Cr and Ta.

In an embodiment, the third source electrode and the third drain electrode are formed of a nitride material or a silicide material containing at least one element selected from the group consisting of Ti, W, Nb, V, Zr, Ni, Pt, Pd, Rh, Ir, Mo, Cr and Ta.

In an embodiment, the first source electrode and the first drain electrode contain titanium oxide.

In an embodiment, the first source electrode and the first drain electrode contain at least one element selected from the group consisting of Ti, W, Nb, V, Zr, Ni Pt, Pd, Rh, Ir, Mo, Cr and Ta.

In an embodiment, the first source electrode and the first drain electrode are formed of a nitride material or a silicide material containing at least one element selected from the group consisting of Ti, W, Nb, V, Zr, Ni, Pt, Pd, Rh, Ir, Mo, Cr and Ta.

In an embodiment, the second source electrode and the second drain electrode contain Cu, Al or Ti.

In an embodiment, the oxide semiconductor layer contains an oxide containing In, Ga and Zn.

A display device according to the present invention is a display device including the above-described semiconductor device.

A method for producing the semiconductor device according to the present invention is a method for producing the above-described semiconductor device.

Advantageous Effects of Invention

The present invention stably realizes a TFT using an oxide semiconductor layer, which has superb TFT characteristics while suppressing increase of the number of production steps and the production cost.

BRIEF DESCRIPTION OF DRAWINGS

FIGS. 1(a) through 1(e) are respectively schematic cross-sectional views of semiconductor devices 100A through 100C, 100B' and 100C' in an embodiment according to the present invention.

FIG. 2 is a schematic cross-sectional view of a semiconductor device 100D in another embodiment according to the present invention.

FIG. 3(a) is a schematic plan view of a pixel section 101 of the semiconductor device 100A, and FIG. 3(b) is a schematic plan view of a gate and source terminal section 102 of the semiconductor device 100A.

FIGS. 4(a) and 4(b) are schematic cross-sectional views of the pixel section 101 and the gate and source terminal section 102 of the semiconductor device 100A taken along lines I-I' and II-II' in FIG. 3.

[FIG. 5] FIGS. 5(a) through 5(d) are schematic cross-sectional views showing production steps of a TFT 10A.

DESCRIPTION OF EMBODIMENTS

A semiconductor device and a method for producing the same in embodiments according to the present invention will be described with reference to the drawings. Note that the present invention is not limited to the embodiments provided herein.

Semiconductor devices 100A through 100D in embodiments according to the present invention will be described. For the sake of simplicity, elements common to TFTs 10A through 10D described as examples will bear identical reference signs.

Figure 1:
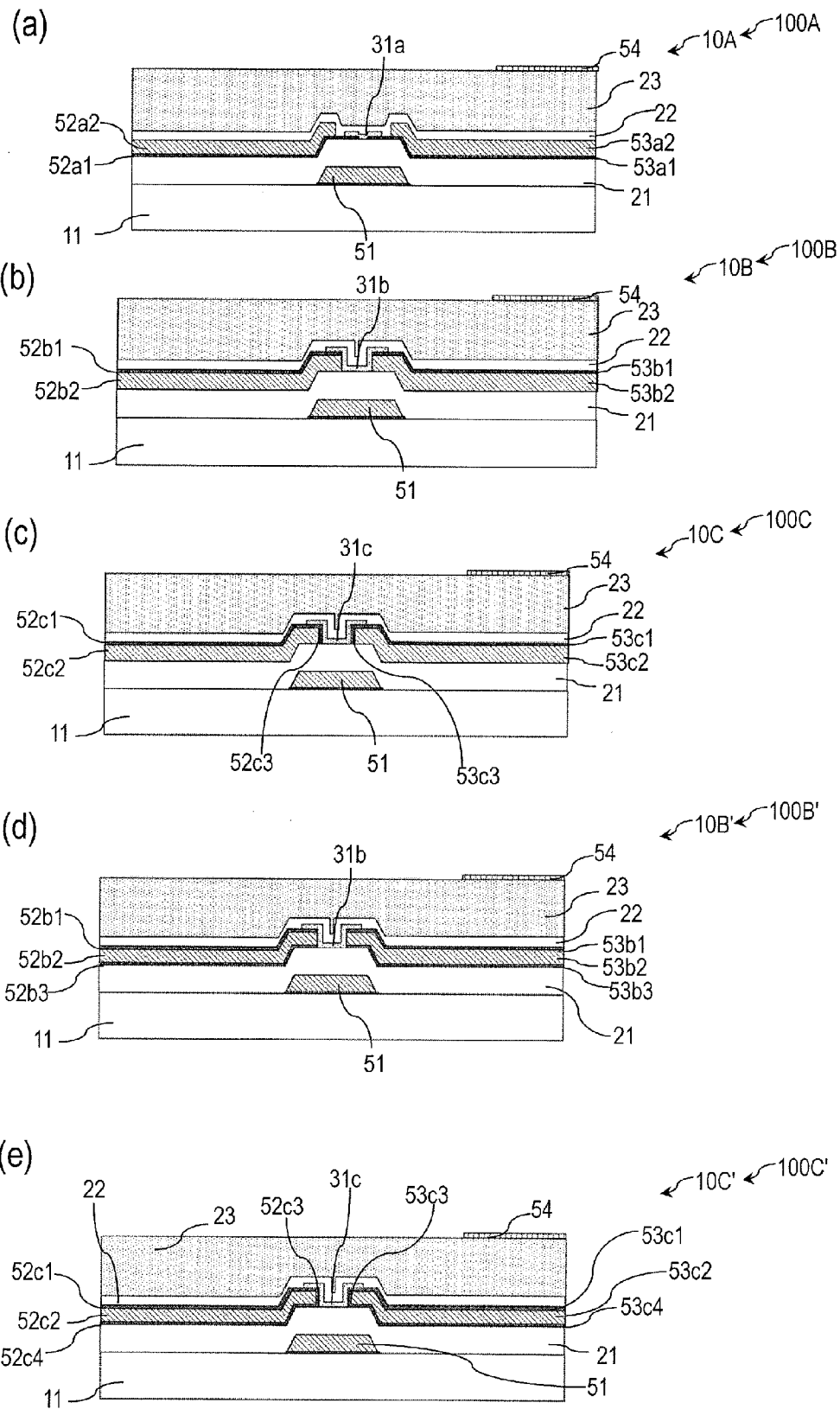
[FIG. 1]
Figure 2:
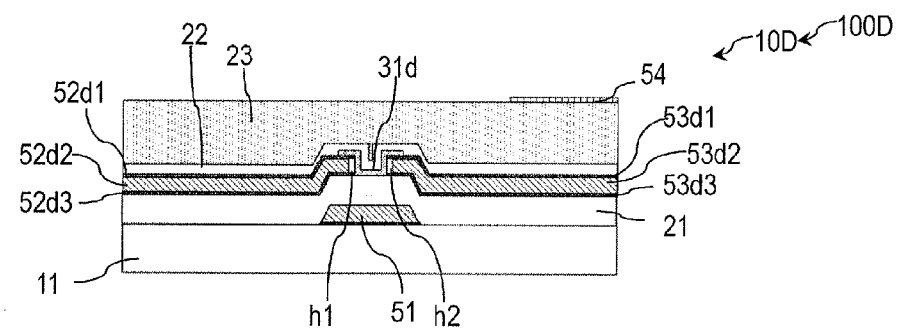
[FIG. 2]

FIG. 1 and FIG. 2 provide schematic cross-sectional views of the semiconductor devices 100A through 100D.

The semiconductor devices 100A, 100B, 100B', 100C, 100C' and 100D respectively include the TFTs 10A, 10B, 10B', 10C, 10C' and 10D on insulating substrates 11 (e.g., glass substrates).

As shown in FIG. 1(a), the TFT 10A includes a gate electrode 51 and a first insulating layer (gate insulating layer) 21 formed on the gate electrode 51. The TFT 10A further includes a first source electrode 52a1 and a second source electrode 52a2 formed on the first insulating layer 21, and a first drain electrode 53a1 and a second drain electrode 53a2 formed on the first insulating layer 21. The second source electrode 52a2 is formed to be in contact with a top surface of the first source electrode 52a1. The second source electrode 52a2 is also formed inner to the first source electrode 52a1; namely, a side surface of the second source electrode 52a2 is on the top surface of the first source electrode 52a1. The second drain electrode 53a2 is formed to so as be in contact with a top surface of the first drain electrode 53a1. The second drain electrode 53a2 is also formed inner to the first drain electrode 53a1; namely, a side surface of the second drain electrode 53a2 is on the top surface of the first drain electrode 53a1. An oxide semiconductor layer 31a is formed to be in contact with the top surface of the first source electrode 52a1 and the top surface of the first drain electrode 53a1. The oxide semiconductor layer 31a is not in contact with either the second source electrode 52a2 or the second drain electrode 53a2. A third source electrode 52a3 (not shown) may be further formed to be in contact with a top surface of the second source electrode 52a2, or a third drain electrode 53a3 (not shown) may be further formed to be in contact with a top surface of the second drain electrode 53a2. In such a case, the oxide semiconductor layer 31a may or may not be in contact with each of the third source electrode 52a3 and the third drain electrode 53a3. The TFT 10A further includes a second insulating layer 22 formed on the oxide semiconductor layer 31a, and a third insulating layer 23 formed on the second insulating layer 22. In addition, the TFT 10A is in contact with a pixel electrode 54 formed on the third insulating layer 23.

As shown in FIG. 1(b), the TFT 10B includes a gate electrode 51 and a first insulating layer (gate insulating layer) 21 formed on the gate electrode 51. The TFT 10B further includes a first source electrode 52b1 and a second source electrode 52b2 formed on the first insulating layer 21, and a first drain electrode 53b1 and a second drain electrode 53b2 formed on the first insulating layer 21. The second source electrode 52b2 is formed to be in contact with a bottom surface of the first source electrode 52b1. The second drain electrode 53b2 is formed to be in contact with a bottom surface of the first drain electrode 53b1. An oxide semiconductor layer 31b is formed to be in contact with a top surface of the first source electrode 52b1 and a top surface of the first drain electrode 53b1. The oxide semiconductor layer 31b is in contact with a side surface of the second source electrode 52b2 and a side surface of the second drain electrode 53b2. The TFT 10B further includes a second insulating layer 22 formed on the oxide semiconductor layer 31b, and a third insulating layer 23 formed on the second insulating layer 22. In addition, the TFT 10B is in contact with a pixel electrode 54 formed on the third insulating layer 23.

As shown in FIG. 1(d), in addition to the structure of the TFT 10B, a third source electrode 52b3 may be formed, between the first insulating layer 21 and the second source electrode 52b2, to be in contact with the second source electrode 52b2. Similarly, a third drain electrode 53b3 may be formed, between the first insulating layer 21 and the second drain electrode 53b2, to be in contact with the second drain electrode 53b2. The TFT including the third source electrode 52b3 and the third drain electrode 53b3 in addition to the structure of the TFT 10B will be referred to as the "TFT 10B'".

As shown in FIG. 1(c), the TFT 10C includes a gate electrode 51 and a first insulating layer (gate insulating layer) 21 formed on the gate electrode 51. The TFT 10C further includes a first source electrode 52c1 and a second source electrode 52c2 formed on the first insulating layer 21, and a first drain electrode 53c1 and a second drain electrode 53c2 formed on the first insulating layer 21. The second source electrode 52c2 is formed to be in contact with a bottom surface of the first source electrode 52c1. The second drain electrode 53c2 is formed to be in contact with a bottom surface of the first drain electrode 53c1. The TFT 10C also includes a third source electrode 52c3 formed on a side surface of the second source electrode 52c2 and a third drain electrode 53c3 formed on a side surface of the second drain electrode 53c2. An oxide semiconductor layer 31c is formed to be in contact with a top surface of the first source electrode 52c1 and a top surface of the first drain electrode 53c1. The oxide semiconductor layer 31c is in contact with the third source electrode 52c3 and the third drain electrode 53c3. The oxide semiconductor layer 31c is not in contact with either the second source electrode 52c2 or the second drain electrode 53c2. The TFT 10C further includes a second insulating layer 22 formed on the oxide semiconductor layer 31c, and a third insulating layer 23 formed on the second insulating layer 22. In addition, the TFT 10C is in contact with a pixel electrode 54 formed on the third insulating layer 23.

As shown in FIG. 1(e), in addition to the structure of the TFT 10C, a fourth source electrode 52c4 may be formed, between the first insulating layer 21 and the second source electrode 52c2, to be in contact with the second source electrode 52c2. Similarly, a fourth drain electrode 53c4 may be formed, between the first insulating layer 21 and the second drain electrode 53c2, to be in contact with the second drain electrode 53c2. The TFT including the fourth source electrode 52c4 and the fourth drain electrode 53c4 in addition to the structure of the TFT 10C will be referred to as the "TFT 10C'".

As shown in FIG. 2, the TFT 10D includes a gate electrode 51 and a first insulating layer (gate insulating layer) 21 formed on the gate electrode 51. The TFT 10D further includes a first source electrode 52d1, a second source electrode 52d2 and a third source electrode 52d3 formed on the first insulating layer 21. The TFT 10D includes a first drain electrode 53d1, a second drain electrode 53d2 and a third drain electrode 53d3 formed on the first insulating layer 21. The second source electrode 52d2 is formed to be in contact with a bottom surface of the first source electrode 52d1. The third source electrode 52d3 is formed to be in contact with a bottom surface of the second source electrode 52d2. The second drain electrode 53d2 is formed to be in contact with a bottom surface of the first drain electrode 53d1. The third drain electrode 53d3 is formed to be in contact with a bottom surface of the second drain electrode 53d2. The second source electrode 52d2 is formed inner to the first and third source electrodes 52d1 and 52d3, and the second drain electrode 53d2 is formed inner to the first and third drain electrodes 53d1 and 53d3. Namely, a side surface of the second source electrode 52d2 is on a top surface of the third source electrode 52d3 and on the bottom surface of the first source electrode 52d1. A side surface of the second drain electrode 53d2 is on a top surface of the third drain electrode 53d3 and on the bottom surface of the first drain electrode 53d1. An oxide semiconductor layer 31d is formed to be in contact with a top surface of the first source electrode 52d1 and a top surface of the first drain electrode 53d1. The TFT 10D has a gap h1 between a side surface of the oxide semiconductor layer 31d and the second source electrode 52d2. The TFT 10D has a gap h2 between a side surface of the oxide semiconductor layer 31d and the second drain electrode 53d2. Therefore, the oxide semiconductor layer 31d is not in contact with either the second source electrode 52d2 or the second drain electrode 53d2. Alternatively, the oxide semiconductor layer 31d may be in contact with either one of the side surface of the second source electrode 52d2 and the side surface of the second drain electrode 53d2. The oxide semiconductor layer 31d is in contact with each of a side surface of the third source electrode 52d3 and a surface of the third drain electrode 53d3. The TFT 10D further includes a second insulating layer 22 formed on the oxide semiconductor layer 31d, and a third insulating layer 23 formed on the second insulating layer 22. In addition, the TFT 10D is in contact with a pixel electrode 54 formed on the third insulating layer 23.

The gate electrode 51 has a stacking structure including, for example, a Ti (titanium) layer as a lower layer and, for example, a Cu (copper) layer formed thereon. The Ti layer has a thickness of, for example, 30 nm to 150 nm, and the Cu layer has a thickness of, for example, 100 nm to 600 nm.

The first insulating layer (gate insulating layer) is formed of, for example, silicon dioxide ($SiO_2$) or silicon nitride ($SiN_x$). The first insulating layer has a thickness of, for example, 100 nm to 500 nm.

The first source electrodes 52a1 through 52d1 and the first drain electrodes 53a1 through 53d1 are formed of, for example, Ti. The first source electrodes 52a1 through 52d1 and the first drain electrodes 53a1 through 53d1 each have a thickness of, for example, 30 nm to 150 nm. The first source electrodes 52a1 through 52d1 and the first drain electrodes 53a1 through 53d1 may be formed of, for example, $TiO_x$ (titanium oxide), W (tungsten), Nb (niobium), V (vanadium), Zr (zirconium), Ni (nickel), Pt (platinum), Pd (palladium), Rh (rhodium), Ir (iridium), Mo (molybdenum), Cr (chromium), Ta (tantalum), an alloy thereof, a nitride material thereof or a silicide material thereof, instead of Ti. The first source electrodes 52a1 through 52d1 and the first drain electrodes 53a1 through 53d1 each have a single layer structure, but may have a stacking structure. The "stacking structure" refers to a structure including two or more layers formed of different metals, oxides, alloys, nitride materials thereof and silicide materials thereof selected from the above-listed materials, and is, for example, a TiN/Ti structure.

The second source electrodes 52a2 through 52d2 and the second drain electrodes 53a2 through 53d2 are formed of, for example, Cu. The second source electrodes 52a2 through 52d2 and the second drain electrodes 53a2 through 53d2 each have a thickness of, for example, 100 nm to 600 nm. The second source electrodes 52a2 through 52d2 and the second drain electrodes 53a2 through 53d2 may be formed of, for example, CuO (copper oxide (II)), Al or Ti instead of Cu. The second source electrodes 52a2 through 52d2 and the second drain electrodes 53a2 through 53d2 each have a single layer structure, but may have a stacking structure. The "stacking structure" refers to a structure including two or more layers formed of different metals and oxides selected from the above-listed materials, and for example, a CuO/Cu structure. In this specification, Cu and Al may each be referred to as a "low-resistance material".

The third source electrodes 52a3 through 52d3 and the third drain electrodes 53a3 through 53d3 are formed of, for example, Ti. The third source electrodes 52a3 through 52d3 and the third drain electrodes 53a3 through 53d3 each have a thickness of, for example, 30 nm to 150 nm. The third source electrodes 52a3 through 52d3 and the third drain electrodes 53a3 through 53d3 may be formed of, for example, $TiO_x$, W, Nb, V, Zr, Ni, Pt, Pd, Rh, Ir, Mo, Cr, Ta, an alloy thereof, a nitride material thereof, or a silicide material thereof, instead of Ti. The third source electrodes 52a3 through 52d3 and the third drain electrodes 53a3 through 53d3 each have a single layer structure, but may have a stacking structure. The "stacking structure" refers to a structure including two or more layers formed of different metals, oxides, alloys, nitride materials thereof and silicide materials thereof selected from the above-listed materials, and is, for example, a TiN/Ti structure.

The fourth source electrode 52c4 and the fourth drain electrode 53c4 are formed of, for example, Ti. The fourth source electrode 52c4 and the fourth drain electrode 53c4 each have a thickness of, for example, 30 nm to 150 nm. The fourth source electrode 52c4 and the fourth drain electrode 53c4 may be formed of, for example, $TiO_x$, W, Nb, V, Zr, Ni, Pt, Pd, Rh, Ir, Mo, Cr, Ta, an alloy thereof, a nitride material thereof, or a silicide material thereof, instead of Ti. The fourth source electrode 52c4 and the fourth drain electrode 53c4 each have a single layer structure, but may have a stacking structure. The "stacking structure" refers to a structure including two or more layers formed of different metals, oxides, alloys, nitride materials thereof and silicide materials thereof selected from the above-listed materials, and is, for example, a TiN/Ti structure.

The oxide semiconductor layers 31a through 31d each contain at least one element selected from the group consisting of In, Zn and G. The oxide semiconductor layers 31a through 31d are each an amorphous metal oxide semiconductor layer (a-IGZO layer) containing elements of, for example, In, Ga and Zn. The oxide semiconductor layers 31a through 31d each have a thickness of, for example, 10 nm to 200 nm.

The second insulating layer 22 is formed of, for example, silicon dioxide or silicon nitride. The second insulating layer 22 has a thickness of, for example, 10 nm to 500 nm.

The third insulating layer 23 is formed of, for example, a photosensitive organic insulating material. The third insulating layer 23 has a thickness of, for example, 1000 nm to 3000 nm.

The pixel electrode 54 is a transparent electrode formed of, for example, ITO (Indium Tin Oxide). The pixel electrode 54 has a thickness of, for example, 50 nm to 200 nm.

The TFTs having such a structure may be produced by a method described later. The oxide semiconductor layers 31a through 31d may be formed after the source and drain electrodes are formed. Therefore, there is no need to form a protective layer for preventing the oxide semiconductor layer from being damaged in the step of patterning for forming the source and drain electrodes. Thus, the number of production steps is not increased, and the production cost is not raised.

According to the investigations performed by the present inventors, in the production steps of a TFT having an oxide semiconductor layer formed of an amorphous oxide (a-IGZO) containing, for example, In, Ga and Zn, it is preferable to perform annealing to reduce the impurity level of the oxide semiconductor layer. However, in the case where, for example, the source electrode and the drain electrode of a TFT, having the oxide semiconductor layer formed of a-IGZO, is formed of Cu or Al, Cu or Al is diffused into the oxide semiconductor layer in the step of annealing, which may deteriorate the TFT characteristics. Especially in the case where the source electrode and the drain electrode are formed of Cu, when the oxide semiconductor layer is in direct contact with the source electrode and the drain electrode, the annealing may reduce the adhesiveness between the oxide semiconductor layer and the source and drain electrodes.

When any of the above-described structures is adopted, the area in which each of the oxide semiconductor layers 31a through 31d is in contact with the low-resistance material (e.g., Cu or Al) is minimized, or each of the oxide semiconductor layers 31a through 31d is not in contact with the low-resistance material, in each of the obtained TFTs. Therefore, the deterioration in the adhesiveness between each of the oxide semiconductor layers 31a through 31d and, for example, Cu, which occurs in the step of annealing, can be suppressed. In addition, the low-resistance material can be prevented from being diffused into each of the oxide semiconductor layers 31a through 31d. As a result, a semiconductor device having superb TFT characteristics is realized.

Figure 3:
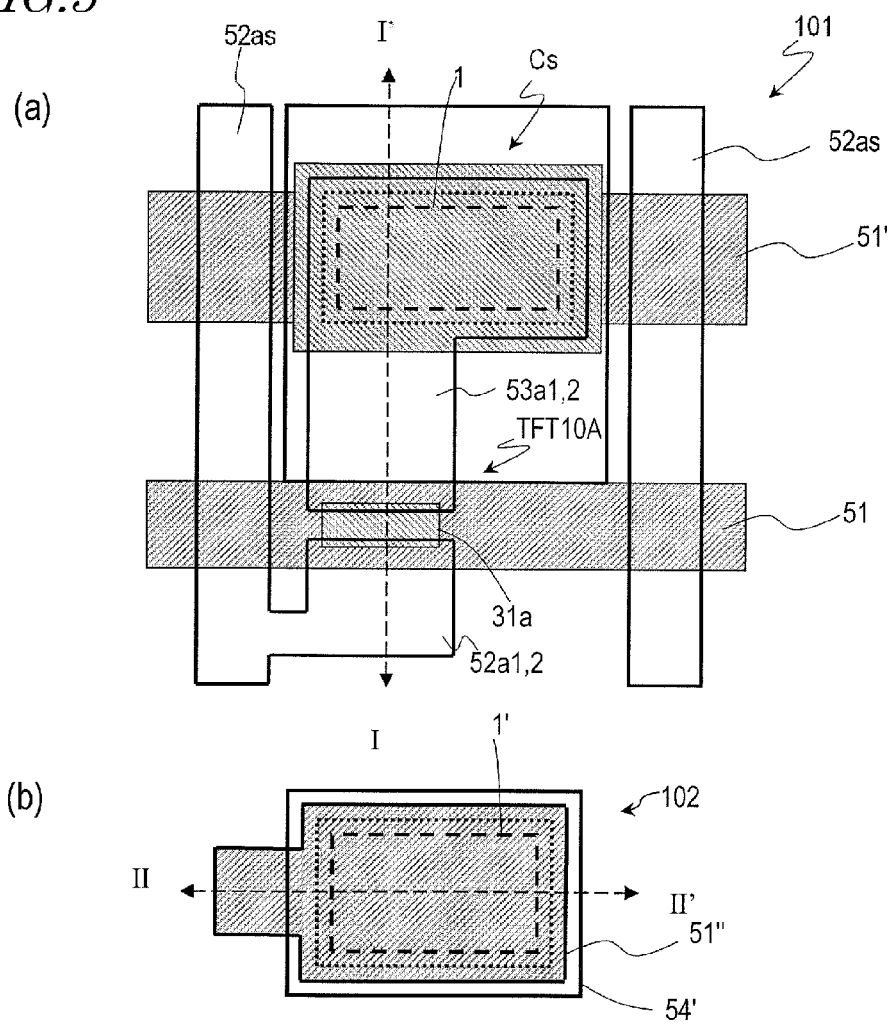
[FIG. 3]
Figure 4:
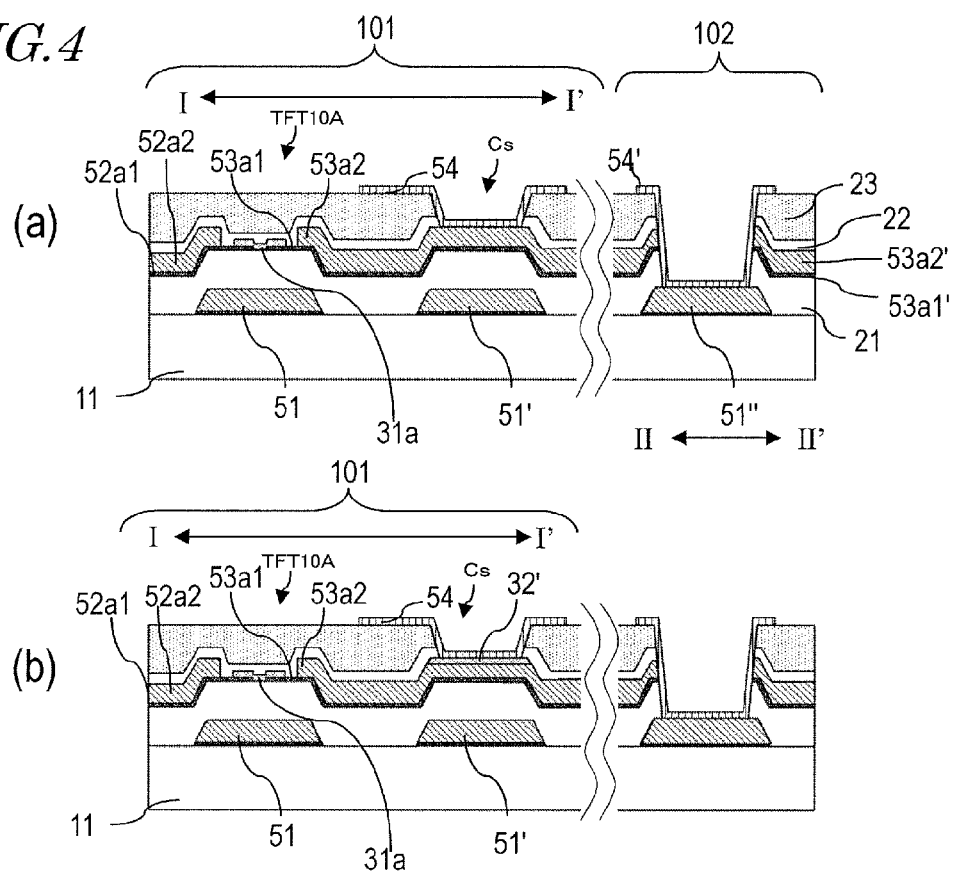
[FIG 4]

FIG. 3 and FIG. 4 schematically show the semiconductor device 100A. FIG. 3(a) is a schematic plan view of a pixel section 101 of the semiconductor device 100A. FIG. 3(b) is a schematic plan view of a gate and source terminal section 102 of the semiconductor device 100A. FIG. 4(a) and FIG. 4(b) are schematic cross-sectional views taken along lines I-I' and II-II' in FIG. 3.

As shown in FIG. 3(a), the pixel section 101 includes source lines 52 as extending in a column direction of pixels, and a gate line 51 and a storage capacitance line 51' extending in a row direction of the pixels. In the vicinity of an intersection of the first source electrode 51a1 and the gate line 51, the TFT 10A is formed. On the storage capacitance line 51', a storage capacitance Cs is formed.

As shown in FIG. 4(a), the oxide semiconductor layer 31a of the TFT 10A is in contact with each of the top surface of the first source electrode 52a1 and the top surface of the first drain electrode 53a1. The first and second drain electrodes 53a1 and 53a2 extend to be above the storage capacitance line 51'. In an opening of the second and third insulating layers 22 and 23 at the storage capacitance Cs, the pixel electrode 54 is in contact with the second drain electrode 53a2.

As shown in FIG. 4(b), an oxide semiconductor layer 32' may be formed between the pixel electrode 54 and the second drain electrode 53a2 in a region of the storage capacitance Cs. In this case, the second drain electrode 53a2 is formed of, for example, Ti or Al.

In the gate and source terminal section 102, a connection section 51" is in contact with a connection section 54' in an opening obtained as a result of the second insulating layer 22 and the third insulating layer 23 being etched at the same time. In the opening 1', the connection section 54' is in contact with a side surface of each of connection sections 53a1' and 53a2'. A connection section 53a3' may be formed on the connection section 53a2'. The connection section 51" is formed of the same material as that of the gate electrode 51. The connection section 53a1' and the connection section 53a3' are formed of the same material as that of the first source electrode 52a1 and the first drain electrode 53a1. The connection section 53a2' is formed of the same material as that of the second source electrode 52a2 and the second drain electrode 53a2. The connection section 54' is formed of the same material as that of the pixel electrode 54.

The TFT formed in the pixel section 101 is not limited to the TFT 10A and may be any of the TFTs 10B through 10D.

The semiconductor devices 100A through 100D are each used for, for example, a display device such as a liquid crystal display device, an organic EL display device or the like.

Now, a method for producing each of the TFTs 10A through 10D will be described.

With reference to FIG. 5, a method for producing the TFT 10A will be specifically described.

As shown in FIG. 5(a), the gate electrode 51 is formed on an insulating substrate (e.g., glass substrate) by a known method. The gate electrode 51 has, for example, a Ti/Cu stacking structure. The gate electrode 51 has a thickness of, for example, 100 nm to 750 nm.

As shown in FIG. 5(b), the first insulating layer (gate insulating layer) 21 is formed on the gate electrode 51. The first insulating layer 21 has, for example, a $SiO_2/SiN_x$ stacking structure. The $SiO_2$ layer has a thickness of, for example, 10 nm to 200 nm. The $SiN_x$ layer has a thickness of, for example, 100 nm to 500 nm. The first insulating layer 21 may have a single layer structure.

Next, a first conductive film 42a and a second conductive film 43a (neither is shown) is formed by a known method. The second conductive film 43a is formed on the first conductive film 42a. The first conductive film 42a has a thickness of, for example, 30 nm to 150 nm. The second conductive film 43a has a thickness of, for example, 100 nm to 600 nm. The first conductive film 42a is formed of, for example, Ti. The first conductive film 42a may be formed of, for example, $TiO_x$, W, Nb, V, Zr, Ni, Pt, Pd, Rh, Ir, Mo, Cr, Ta, an alloy thereof, a nitride material thereof, or a silicide material thereof, instead of Ti. The first conductive film 42a has a single layer structure, but may have a stacking structure. The "stacking structure" refers to a structure including two or more layers formed of different metals, oxides, alloys, nitride materials thereof and silicide materials thereof selected from the above-listed materials, and is, for example, a TiN/Ti structure. The second conductive film 43a is formed of, for example, Cu. The second conductive film 43a may be formed of, for example, CuO, Al or Ti instead of Cu. The second conductive film 43a has a single layer structure, but may have a stacking structure. The "stacking structure" refers to a structure including two or more layers formed of different metals and oxides selected from the above-listed materials, and is, for example, structure CuO/Cu structure.

Next, by patterning the first conductive film 42a, the first source electrode 52a1 and the first drain electrode 53a1 are formed. By patterning the second conductive film 43a, the second source electrode 52a2 and the second drain electrode 53a2 are formed. In this step, the second source electrode 52a2 is formed inner to the first source electrode 52a1; namely, the side surface of the second source electrode 52a2 is on the top surface of the first source electrode 52a1. The second drain electrode 53a2 is formed inner to the first drain electrode 53a1; namely, the side surface of the second drain electrode 53a2 is on the top surface of the first drain electrode 53a1. The above-described layers are formed such that distance (channel length) A1 between a side surface of the first source electrode 52a1 and a side surface of the first drain electrode 53a1 is shorter than distance A2 between the side surface of the second source electrode 52a2 and the side surface of the second drain electrode 53a2. A difference between the distance A2 and the distance A1 (distance A2−distance A1) is preferably, for example, 2 μm or greater, and is more preferably, for example, 4 μm or greater. Owing to such a relationship, the oxide semiconductor layer 31a can be formed not to be in contact with either the second source electrode 52a2 or the second drain electrode 53a2.

Next, the oxide semiconductor layer 30 (not shown) is formed by, for example, sputtering. The oxide semiconductor layer 30 has a thickness of, for example, 10 nm to 200 nm. The oxide semiconductor layer 30 is formed of at least one element selected from the group consisting of In, Zn and Ga. The oxide semiconductor layer 30 is formed of, for example, a-IGZO. Then, as shown in FIG. 5(c), the oxide semiconductor layer 31a is formed of the oxide semiconductor layer 30 by a known method. In this step, the oxide semiconductor layer 31a is formed to be in contact with the first source electrode 52a1 and the first drain electrode 53a1 and formed not to be in contact with either the second source electrode 52a2 or the second drain electrode 53a2. In this step, where the distance between the second source electrode 52a2 and the oxide semiconductor layer 31a is L1 and the distance between the second drain electrode 53a2 and the oxide semiconductor layer 31a is L2, the distances L1 and L2 are each preferably 2 μm or greater.

Next, as shown in FIG. 5(d), the second insulating layer 22 is formed on the oxide semiconductor layer 31a. The second insulating layer 22 has a thickness of, for example, 10 nm to 500 nm. The second insulating layer 22 is formed of, for example, silicon dioxide or silicon nitride. Preferably, the second insulating layer 22 is formed of silicon nitride.

Next, annealing is performed. The annealing is performed under the conditions of, for example, a temperature of 350° C. for 1 hour. Owing to the annealing, the obtained TFT has stable ON/OFF characteristics.

Next, the third insulating layer 23 is formed on the second insulating layer 22 by a known method. The third insulating layer 23 has a thickness of, for example, 1000 nm to 3000 nm. The third insulating layer 23 is formed of, for example, a photosensitive organic insulating material.

Next, the pixel electrode 54 is formed on the third insulating layer 23 by a known method. As a result, the TFT 10A shown in FIG. 1(a) is obtained. The pixel electrode 54 has a thickness of, for example, 50 nm to 200 nm. The pixel electrode 54 is a transparent electrode formed of, for example, ITO.

Now, a method for producing the TFT 10B will be described. Steps common to those of the method for producing the TFT 10A will be omitted, and elements common to those of the TFT 10A will bear identical reference signs thereto.

The layers are formed up to the first insulating layer 21 by the above-described method.

Next, a first conductive film 42b and a second conductive film 43b (neither is shown) is formed on the first insulating layer 21 by a known method. The second conductive film 43b is formed to be in contact with a bottom surface of the first conductive film 42b. The first conductive film 42b has a thickness of, for example, 30 nm to 150 nm. The second conductive film 43b has a thickness of, for example, 100 nm to 600 nm. The first conductive film 42b is formed of, for example, Ti. The first conductive film 42b may be formed of, for example, $TiO_x$, W, Nb, V, Zr, Ni, Pt, Pd, Rh, Ir, Mo, Cr, Ta, an alloy thereof, a nitride material thereof, or a silicide material thereof, instead of Ti. The first conductive film 42b has a single layer structure, but may have a stacking structure. The "stacking structure" refers to a structure including two or more layers formed of different metals, oxides, alloys, nitride materials thereof and silicide materials thereof selected from the above-listed materials, and is, for example, a TiN/Ti structure. The second conductive film 43b is formed of, for example, Cu. The second conductive film 43b may be formed of, for example, CuO, Al or Ti instead of Cu. The second conductive film 43b has a single layer structure, but may have a stacking structure. The "stacking structure" refers to a structure including two or more layers formed of different metals and oxides selected from the above-listed materials, and is, for example, a CuO/Cu structure. A third conductive film 46b (not shown) may be formed between the first insulating layer 21 and the second conductive film 43b. The third conductive film 46b has a thickness of, for example, 30 nm to 150 nm. The third conductive film 46b is formed of, for example, Ti. The third conductive film 46b may be formed of, for example, TiO, W, Nb, V, Zr, Ni, Pt, Pd, Rh, Ir, Mo, Cr, Ta, an alloy thereof, a nitride material thereof, or a silicide material thereof, instead of Ti. The third conductive film 46b has a single layer structure, but may have a stacking structure. The "stacking structure" refers to a structure including two or more layers formed of different metals, oxides, alloys, nitride materials thereof and silicide materials thereof selected from the above-listed materials, and is, for example, a TiN/Ti structure.

Next, by patterning the first conductive film 42b, the first source electrode 52b1 and the first drain electrode 53b1 are formed. By patterning the second conductive film 43b, the second source electrode 52b2 and the second drain electrode 53b2 are formed.

Next, the oxide semiconductor layer 30 is formed by the above-described method.

Next, an oxide semiconductor layer 31b is obtained from the oxide semiconductor layer 30 by patterning performed in a known method. In this step, the oxide semiconductor layer 31b is formed to be in contact with the top surface of the first source electrode 52b1 and the top surface of the first drain electrode 53b1. The oxide semiconductor layer 31b is also formed to be in contact with the side surface of the second source electrode 52b2 and the side surface of the second drain electrode 53b2. The third source electrode 52b3 may be formed between the first insulating layer 21 and the second source electrode 52b2. The third drain electrode 53b3 may be formed between the first insulating layer 21 and the second drain electrode 53b2. In this case, the third source electrode 52b3 and the third drain electrode 53b3 are formed of the third conductive film 46b described above.

Then, the TFT 10B shown in FIG. 1(b) is produced by the above-described method. In the case where the third source electrode 52b3 and the third drain electrode 53b3 are formed, the TFT 10B' shown in FIG. 1(d) is produced.

Now, a method for producing the TFT 10C will be described. Steps common to those of the method for producing the TFT 10B will be omitted, and elements common to those of the TFT 10B will bear identical reference signs thereto.

The layers are formed up to the first insulating layer 21 by the above-described method.

Next, a first conductive film 42c and a second conductive film 43c (neither is shown) is formed on the first insulating layer 21 by a known method. The second conductive film 43c is formed to be in contact with a bottom surface of the first conductive film 42c. The first conductive film 42c has a thickness of, for example, 30 nm to 150 nm. The second conductive film 43c has a thickness of, for example, 100 nm to 600 nm. The first conductive film 42c is formed of, for example, Ti. The first conductive film 42c may be formed of, for example, $TiO_x$, W, Nb, V, Zr, Ni, Pt, Pd, Rh, Ir, Mo, Cr, Ta, an alloy thereof, a nitride material thereof, or a silicide material thereof, instead of Ti. The first conductive film 42c has a single layer structure, but may have a stacking structure. The "stacking structure" refers to a structure including two or more layers formed of different metals, oxides, alloys, nitride materials thereof and silicide materials thereof selected from the above-listed materials, and is, for example, a TiN/Ti structure. The second conductive film 43c is formed of, for example, Cu. The second conductive film 43c may be formed of, for example, CuO, Al or Ti instead of Cu. The second conductive film 43c has a single layer structure, but may have a stacking structure. The "stacking structure" refers to a structure including two or more layers formed of different metals and oxides selected from the above-listed materials, and is, for example, a TiN/Ti structure. A fourth conductive film 46c (not shown) may be formed between the first insulating layer 21 and the second conductive film 43c. The fourth conductive film 46c has a thickness of, for example, 30 nm to 150 nm. The fourth conductive film 46c is formed of, for example, Ti. The fourth conductive film 46c may be formed of, for example, TiO, W, Nb, V, Zr, Ni, Pt, Pd, Rh, Ir, Mo, Cr, Ta, an alloy thereof, a nitride material thereof, or a silicide material thereof, instead of Ti. The fourth conductive film 46c has a single layer structure, but may have a stacking structure. The "stacking structure" refers to a structure including two or more layers formed of different metals, oxides, alloys, nitride materials thereof and silicide materials thereof selected from the above-listed materials, and is, for example, a TiN/Ti structure.

Next, by patterning the first conductive film 42c, the first source electrode 52c1 and the first drain electrode 53c1 are formed. By patterning the second conductive film 43c, the second source electrode 52c2 and the second drain electrode 53c2 are formed. The fourth source electrode 52c4 may be formed between the first insulating layer 21 and the second source electrode 52c2, and the fourth drain electrode 53c4 may be formed between the first insulating layer 21 and the second drain electrode 53c2. The fourth source electrode 52c4 and the fourth drain electrode 53c4 are formed of the fourth conductive film 46c.

Next, a third conductive film 44c is formed to cover the side surface of the second source electrode 52c2 and the side surface of the second drain electrode 53c2 by a known method. The third conductive film 44c has a thickness of, for example, 30 nm to 150 nm. The third conductive film 44c is formed of, for example, Ti. The third conductive film 44c may be formed of, for example, $TiO_x$, W, Nb, V, Zr, Ni, Pt, Pd, Rh, Ir, Mo, Cr, Ta, an alloy thereof, a nitride material thereof, or a silicide material thereof, instead of Ti. The third conductive film 44c has a single layer structure, but may have a stacking structure. The "stacking structure" refers to a structure including two or more layers formed of different metals, oxides, alloys, nitride materials thereof and silicide materials thereof selected from the above-listed materials, and is, for example, a TiN/Ti structure.

Next, the third conductive film 44c is patterned by a known method to form the third source electrode 52c3 and the third drain electrode 53c3. The third source electrode 52c3 is formed to cover the side surface of the second source electrode 52c2, and the third drain electrode 53c3 is formed to cover the side surface of the second drain electrode 53c2.

Next, the oxide semiconductor layer 30 is formed by a known method.

Next, an oxide semiconductor layer 31c is formed of the oxide semiconductor layer 30 by patterning performed in a known method. In this step, the oxide semiconductor layer 31c is formed to be in contact with the top surface of the first source electrode 52c1 and the top surface of the first drain electrode 53c1. The oxide semiconductor layer 31c is also formed to be in contact with the third source electrode 52c3 and the third drain electrode 53c3. The oxide semiconductor layer 31c is not in contact with either the second source electrode 52c2 or the third drain electrode 53c2.

Then, the TFT 10C shown in FIG. 1(c) is produced by the above-described method. In the case where the fourth source electrode 52c4 and the fourth drain electrode 53c4 are formed, the TFT 10C' shown in FIG. 1(e) is produced.

Now, a method for producing the TFT 10D will be described. Steps common to those of the method for producing the TFT 10B will be omitted, and elements common to those of the TFT 10B will bear identical reference signs thereto.

The layers are formed up to the first insulating layer 21 by the above-described method.

Next, a first conductive film 42d, a second conductive film 43d and a third conductive film 44d (none of them is shown) is formed on the insulating layer 21 by a known method. The second conductive film 43d is formed below the first conductive film 42d, and the third conductive film 44d is formed below the second conductive film 43d. The first conductive film 42d and the third conductive film 44d each have a thickness of, for example, 30 nm to 150 nm. The second conductive film 43d has a thickness of, for example, 100 nm to 600 nm. The first conductive film 42d and the third conductive film 44d are formed of, for example, Ti. The first conductive film 42d and the third conductive film 44d may be formed of, for example, $TiO_x$, W, Nb, V, Zr, Ni, Pt, Pd, Rh, Ir, Mo, Cr, Ta, an alloy thereof, a nitride material thereof, or a silicide material thereof, instead of Ti. The first conductive film 42d and the third conductive film 44d each have a single layer structure, but may have a stacking structure. The "stacking structure" refers to a structure including two or more layers formed of different metals, oxides, alloys, nitride materials thereof and silicide materials thereof selected from the above-listed materials, and is, for example, a TiN/Ti structure. The second conductive film 43d is formed of, for example, Cu. The second conductive film 43d may be formed of, for example, CuO, Al or Ti instead of Cu. The second conductive film 43d has a single layer structure, but may have a stacking structure. The "stacking structure" refers to a structure including two or more layers formed of different metals and oxides selected from the above-listed materials, and is, for example, a CuO/Cu structure.

Next, by patterning the first conductive film 42d, the first source electrode 52d1 and the first drain electrode 53d1 are formed. By patterning the second conductive film 43d, the second source electrode 52d2 and the second drain electrode 53d2 are formed. By patterning the third conductive film 44d, the third source electrode 52d3 and the third drain electrode 53d3 are formed. In this step, the second source electrode 52d2 is formed inner to the first source electrode 52d1 and the third source electrode 52d3 because of the difference in the etching rate between the first and third conductive films 42d and 44d and the second conductive film 43d. Namely, the side surface of the second source electrode 52d2 is on the top surface of the third source electrode 52d3 and on the bottom surface of the first source electrode 52d1. Similarly, the second drain electrode 53d2 is formed inner to the first drain electrode 53d1 and the third drain electrode 53d3. Namely, the side surface of the second drain electrode 53d2 is on the top surface of the third drain electrode 53d3 and on the bottom surface of the first drain electrode 53d1.

Next, the oxide semiconductor layer 30 is formed by the above-described method.

Next, an oxide semiconductor layer 31d is formed of the oxide semiconductor layer 30 by patterning performed in a known method. In this step, the oxide semiconductor layer 31d is formed to be in contact with the top surface of the first source electrode 52d1 and the top surface of the first drain electrode 53d1. The oxide semiconductor layer 31d is also formed not to be in contact with the second source electrode 52d2 or the second drain electrode 53d2. The oxide semiconductor layer 31d is formed to be in contact with a side surface of the third source electrode 52d3 and a side surface of the third drain electrode 53d3. The gap h1 is formed between the second source electrode 52d2 and the oxide semiconductor layer 31d. The gap h2 is formed between the second drain electrode 53d2 and the oxide semiconductor layer 31d. Preferably, the gaps h1 and h2 each have a width of 1 μm or greater. When the width of each of the gaps h1 and h2 is 1 μm or greater, generation of a chloride can be prevented in the step of forming the source electrode and the drain electrode by etching from a metal film containing, for example, Ti/Cu. The oxide semiconductor layer 31d may be in contact with either one of the side surface of the second source electrode 52d2 and the side surface of the second drain electrode 53d2.

Then, the TFT 10D shown in FIG. 2 is produced by the above-described method.

In such production methods, the oxide semiconductor layers 31a through 31d are each formed after the source and drain electrodes are formed. Therefore, there is no need to form a protective layer for preventing the oxide semiconductor layer from being damaged in the step of patterning for forming the source and drain electrodes. Thus, the number of production steps is not increased, and the production cost is not raised. In addition, the area in which each of the oxide semiconductor layers 31a through 31d is in contact with the low-resistance material (e.g., Cu or Al) is minimized, or each of the oxide semiconductor layers 31a through 31d is not in contact with the low-resistance material, in each of the obtained TFTs. Therefore, diffusion of the low-resistance material into each of the oxide semiconductor layers 31a through 31d can be prevented. Moreover, the problem of deterioration in the adhesiveness between each of the oxide semiconductor layers 31a through 31d and, for example, Cu can be alleviated. As a result, a semiconductor device having superb TFT characteristics in the embodiments according to the present invention can be produced.

Industrial Applicability

The present invention has a very wide range of applications, and is applicable to semiconductor devices including TFTs, and all the fields of electronic devices including such semiconductor devices. The present invention is applicable to, for example, active matrix type liquid crystal display devices and organic EL display devices. Such display devices are usable for, for example, display screens of mobile phones and mobile game devices, monitors of digital cameras, and the like. Therefore, the present invention is applicable to all the electronic devices including liquid crystal display devices or organic EL display devices.

REFERENCE SIGNS LIST 1, 1' Opening
10, 10A, 10B, 10B', 10C, 10C', 10D TFT
11 Insulating substrate
21, 22, 23 Insulating layer
31a, 31b, 31c, 31d, 32' Oxide semiconductor layer
51 Gate electrode (gate line)
51' Storage capacitance line
52as Source line
54 Pixel electrode
51", 53a1', 53a2', 53a3', 54' Connection section
100A, 100B, 100B', 100C, 100C', 100D Semiconductor device

The invention claimed is:

1. A semiconductor device, comprising:
an insulating substrate;
a gate electrode formed on the insulating substrate;
an insulating layer formed on the gate electrode;
an oxide semiconductor layer formed on the insulating layer and containing at least one element selected from the group consisting of In, Zn and Ga;
first and second source electrodes formed on the insulating layer;
first and second drain electrodes formed on the insulating layer;
a third source electrode formed, between the insulating layer and the second source electrode, to be in contact with the second source electrode; and
a third drain electrode formed, between the insulating layer and the second drain electrode, to be in contact with the second drain electrode; wherein:
the second source electrode is formed to be in contact with a bottom surface of the first source electrode;
the second drain electrode is formed to be in contact with a bottom surface of the first drain electrode;
the oxide semiconductor layer is formed to be in contact with a top surface of the first source electrode and a top surface of the first drain electrode; and
the third source electrode and the third drain electrode are made of only titanium oxide.

2. The semiconductor device of claim 1, wherein the oxide semiconductor layer is in contact with a side surface of the second source electrode and a side surface of the second drain electrode.

3. The semiconductor device of claim 1, wherein the first source electrode and the first drain are made of only titanium oxide.

4. The semiconductor device of claim 1, wherein the second source electrode and the second drain electrode contain Cu, Al or Ti.

5. The semiconductor device of claim 1, wherein the oxide semiconductor layer contains all of In, Ga and Zn.

6. A display device, comprising a pixel electrode and the semiconductor device of claim 1.

7. A method for producing the semiconductor device of claim 1.

8. The semiconductor device of claim 1, wherein the first source electrode and the first drain electrode include titanium oxide.

* * * * *